United States Patent
Maurino (10) Patent No.: US 11,121,718 B1
(45) Date of Patent: Sep. 14, 2021

(54) MULTI-STAGE SIGMA-DELTA ANALOG-TO-DIGITAL CONVERTER WITH DITHER

(71) Applicant: Analog Devices International Unlimited Company, Limerick (IE)

(72) Inventor: Roberto Sergio Matteo Maurino, Turin (IT)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/991,751

(22) Filed: Aug. 12, 2020

(51) Int. Cl.
| | |
|---|---|
| H03M 3/00 | (2006.01) |
| H03M 1/20 | (2006.01) |
| H03M 1/12 | (2006.01) |
| H03M 1/06 | (2006.01) |
| H03M 1/18 | (2006.01) |
| H03M 1/50 | (2006.01) |

(52) U.S. Cl.
CPC ......... *H03M 1/201* (2013.01); *H03M 1/0626* (2013.01); *H03M 1/0668* (2013.01); *H03M 1/122* (2013.01); *H03M 1/186* (2013.01); *H03M 1/504* (2013.01)

(58) Field of Classification Search
CPC ........ H03M 3/332; H03M 3/424; H03M 3/43; H03M 1/0641; H03M 1/201; H03M 7/3008; H03M 3/328; H03M 3/502; H03M 1/12; H03M 1/66; H03M 1/0668; H03M 3/50; H03M 7/3028; H03M 7/3042; H03M 1/462; H03M 1/74; H03M 3/30; H03M 3/3287
USPC ................................................ 341/131, 143
See application file for complete search history.

(56) References Cited

U.S. PATENT DOCUMENTS

| | | | |
|---|---|---|---|
| 5,073,778 A | 12/1991 | Ueki et al. | |
| 5,144,308 A * | 9/1992 | Norsworthy | .......... H03M 3/332 341/131 |
| 6,175,321 B1 * | 1/2001 | Frannhagen | ........ H03M 7/3008 341/143 |
| 6,351,229 B1 | 2/2002 | Wang | |
| 6,744,392 B2 | 6/2004 | Melanson | |
| 6,920,182 B2 | 7/2005 | Bolton, Jr. | |
| 7,277,032 B2 | 10/2007 | Lin | |
| 7,301,489 B2 | 11/2007 | Lin | |
| 7,471,223 B2 | 12/2008 | Lee | |

(Continued)

FOREIGN PATENT DOCUMENTS

WO    WO-02078193 A1    10/2002

OTHER PUBLICATIONS

Hirota, Atsushi, et al., "A Novel Delta-Sigma Modulated DC-DC Power Converter utilizing Dither Signal", Proc. of the IEEE 31st Annual Power Electronics Specialists Conference, (Jun. 2000), 831-836.

*Primary Examiner* — Linh V Nguyen
(74) *Attorney, Agent, or Firm* — Schwegman Lundberg & Woessner, P.A.

(57) ABSTRACT

Techniques to implement subtractive dither in a multi-stage ADC. Subtractive dither involves adding a first dither signal at a first node and adding a second dither signal at a second node (which can be the same as the first node), where the first and second dither signal combine and sum to approximately zero. By utilizing subtractive dither in a multi-stage ADC, the headroom requirements of a loop filter in a main loop of the ADC and the range requirements of a feedback DAC in the main loop can both be relaxed.

20 Claims, 5 Drawing Sheets

(56) References Cited

U.S. PATENT DOCUMENTS

| | | | |
|---|---|---|---|
| 7,961,125 B2 | 6/2011 | Deval et al. | |
| 8,766,836 B2 * | 7/2014 | Maurino | H03M 3/328 |
| | | | 341/143 |
| 9,118,341 B2 | 8/2015 | Matsumoto et al. | |
| 9,178,529 B2 | 11/2015 | Dong et al. | |
| 9,231,606 B2 | 1/2016 | Bourdi et al. | |
| 9,385,745 B1 | 7/2016 | Op 't Eynde et al. | |
| 9,503,120 B1 | 11/2016 | Tan et al. | |
| 9,590,590 B2 | 3/2017 | Li et al. | |
| 9,735,797 B2 * | 8/2017 | Zhao | H03M 1/1038 |
| 9,800,262 B1 | 10/2017 | Maurino et al. | |
| 9,838,031 B2 | 12/2017 | Dong et al. | |
| 10,659,074 B2 * | 5/2020 | Nakamoto | H03M 3/332 |
| 2002/0121994 A1 * | 9/2002 | Bolton, Jr. | H03M 7/3008 |
| | | | 341/143 |
| 2008/0258949 A1 * | 10/2008 | Galton | H03M 1/1004 |
| | | | 341/120 |
| 2015/0109158 A1 * | 4/2015 | Dong | H03M 3/344 |
| | | | 341/143 |
| 2017/0179975 A1 * | 6/2017 | Dong | H03M 3/388 |

\* cited by examiner

MULTI-STAGE SIGMA-DELTA ANALOG-TO-DIGITAL CONVERTER WITH DITHER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics can be provided with one or more sensors to make measurements, and these sensors can generate an analog signal. The analog signal can then be provided to an analog-to-digital converter (ADC) as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

A difference between the input voltage and the output voltage of the ADC can correspond to the quantization error of the ADC. In some ADCs, the quantization error can be further processed by ADC circuitry to "shape" the quantization error, which appears as quantization noise in the frequency domain. Noise shaping techniques can push the quantization noise away from the signal band of interest and into higher frequencies, for example.

A sigma-delta modulator is a feedback system that can achieve high-resolution digital signals. Sigma-delta modulators have been implemented in a wide variety of electronic circuits, including but not limited to, analog-to-digital converters (ADCs), digital-to-analog converters (DACs), frequency synthesizers, and other electronic circuits.

ADCs based on sigma-delta modulation have been widely used in digital audio and high precision instrumentation systems. Typically, a sigma-delta ADC encodes an analog signal using a sigma-delta modulator (e.g., using a low resolution ADC such as a 1-bit ADC, Flash ADC, Flash quantizer, etc.) and then, if applicable, applies a digital filter to the output of the sigma-delta modulator to form a higher-resolution digital output. A loop filter can be provided to provide error feedback to the sigma-delta modulator. One characteristic of a sigma-delta modulator is its noise shaping capability. As a result, sigma-delta ADCs are generally able to achieve high resolution analog-to-digital conversion.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

SUMMARY OF THE DISCLOSURE

This disclosure describes various techniques to implement subtractive dither in a multi-stage ADC. Subtractive dither involves adding a first dither signal at a first node and adding a second dither signal at a second node (which can be the same as the first node), where the first and second dither signal combine and sum to approximately zero. By utilizing subtractive dither in a multi-stage ADC, the headroom requirements of a loop filter in a main loop of the ADC and the range requirements of a feedback DAC in the main loop can both be relaxed.

In some aspects, this disclosure is directed to a multi-stage sigma-delta analog-to-digital converter (ADC) configured to receive an analog input signal at an input and generate a digital output signal, the multi-stage sigma-delta ADC comprising: an input summing node configured to receive and combine the analog input signal and an output of at least one digital-to-analog converter (DAC) circuit; a first stage ADC configured to receive the analog input signal and a first dither signal and to generate a first output to the at least one digital-to-analog converter (DAC) circuit; and a second stage sigma-delta modulator configured to receive an output of the input summing node and a second dither signal and to generate a second output to the at least one digital-to-analog converter (DAC) circuit, wherein the first dither signal and the second dither signal offset one another at a node coupled to an input of the at least one DAC circuit.

In some aspects, this disclosure is directed to a method of using a multi-stage sigma-delta analog-to-digital converter (ADC) configured to receive an analog input signal at an input and generate a digital output signal, the method comprising: receiving and combining the analog input signal and an output of at least one digital-to-analog converter (DAC) circuit at an input summing node; receiving, by a first stage ADC, the analog input signal and a first dither signal and generating a first output to the at least one digital-to-analog converter (DAC) circuit; and receiving, by a second stage sigma-delta modulator, an output of the input summing node and a second dither signal and generating a second output to the at least one digital-to-analog converter (DAC)

circuit, wherein the first dither signal and the second dither signal offset one another at a node coupled to an input of the at least one DAC circuit.

In some aspects, this disclosure is directed to a multi-stage sigma-delta analog-to-digital converter (ADC) configured to receive an analog input signal at an input and generate a digital output signal, the multi-stage sigma-delta ADC comprising: means for receiving and combining the analog input signal and an output of at least one digital-to-analog converter (DAC) circuit; means for receiving, by a first stage ADC, the analog input signal and a first dither signal and generating a first output to the at least one digital-to-analog converter (DAC) circuit; and means for receiving, by a second stage sigma-delta modulator, an output of an input summing node and a second dither signal and generating a second output to the at least one digital-to-analog converter (DAC) circuit, wherein the first dither signal and the second dither signal offset one another at a node coupled to an input of the at least one DAC circuit.

DETAILED DESCRIPTION

Sigma-delta modulators operating at low input values or with DC inputs can suffer from tonal behavior. For example, the output spectrum can show large tones, which can result in a degradation in signal-noise ratio (SNR). Dither, which is an intentionally applied form of noise, can be introduced to break such tones. For example, dither can cause the tones to spread out and become white noise, resulting in no tones at particular frequencies.

However, the introduction of dither can require a loop filter with additional headroom. For example, if dither is introduced before the quantizer, the quantization noise is increased, which increases the noise range, thereby requiring additional headroom. In addition, if a loop is used, a feedback digital-to-analog converter (DAC) will typically need additional levels due to the added dither, which can increase the complexity of the DAC.

This disclosure describes various techniques to implement subtractive dither in a multi-stage ADC. Subtractive dither involves adding a first dither signal at a first node and adding a second dither signal at a second node (which can be the same as the first node), where the first and second dither signal combine and sum to approximately zero. By utilizing subtractive dither in a multi-stage ADC, the headroom requirements of a loop filter in a main loop of the ADC and the range requirements of a feedback DAC in the main loop can both be relaxed.

Figure 1:
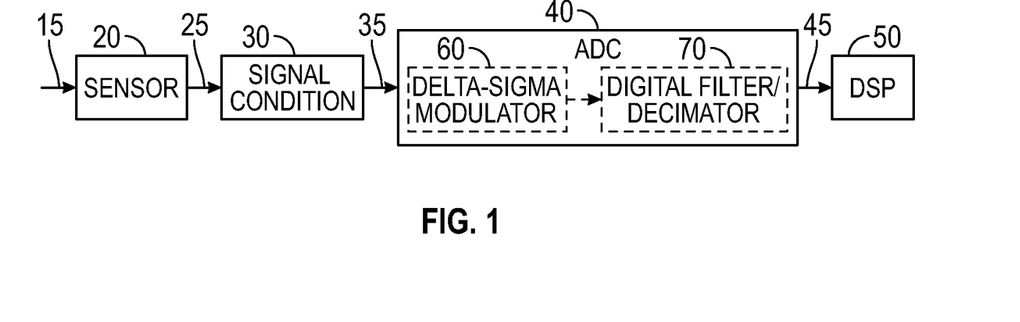
FIG. 1 is a schematic block diagram of an example of a data acquisition system, which can implement a sigma-delta modulator.

FIG. 1 is a schematic block diagram of an example of a data acquisition system 10, which can implement a sigma-delta modulator. The data acquisition system 10 can be an electronic device (including an electronic circuit and/or one or more components) configured to convert signals (such as analog signals) into a usable form. In various implementations, the data acquisition system 10 can convert physical conditions into digital form, which can be stored and/or analyzed. FIG. 1 has been simplified for the sake of clarity. Additional features can be added in the data acquisition system 10, and some of the features described can be replaced or eliminated in other embodiments of the data acquisition system 10.

In FIG. 1, the data acquisition system 10 can include an input signal 15 that represents a physical condition, such as temperature, pressure, velocity, flow rate, position, other physical condition, or combination thereof. A sensor circuit block 20 can receive an input signal 15 and convert the physical condition (represented by input signal 15) into an electrical signal, such as an analog signal 25. The analog signal 25 can be a voltage or current that represents the physical condition (represented by the input signal 15).

A signal conditioning circuit block 30 can receive and adjust the analog signal 25 within an acceptable range of an analog-to-digital converter (ADC), providing a conditioned analog signal 35. The conditioned analog signal 35 can be provided at ADC circuit block 40, such that the signal conditioning circuit block 30 can act as an interface between the sensor circuit block 20 and the ADC circuit block 40, the conditioning analog signal 25 (and thus providing the conditioned analog signal 35) before the ADC circuit block 40 digitizes the analog signal. The signal conditioning circuit block 30 can amplify, attenuate, filter, and/or perform other conditioning functions to the analog signal 25. The ADC circuit block 40 can receive and convert the conditioned analog signal 35 into digital form, providing a digital signal 45. The digital signal 45 can represent the physical quantity received by the sensor via the input signal 15. A digital signal processor (DSP) circuit block 50 can receive and process digital signal 45.

The ADC circuit block 40 can include a sigma-delta ADC that generates a digital signal using a feedback technique, where the sigma-delta ADC can oversample its input signal (here, the conditioned analog signal 35) and perform noise-shaping to achieve a high-resolution digital signal (here, the digital signal 45). The sigma-delta ADC can include a sigma-delta modulator 60 and a digital filter/decimator 70. The sigma-delta modulator 60 can use oversampling (for example, a sampling rate above Nyquist rate) and filtering to generate a digital signal that represents the input signal received by the sigma-delta ADC (such as the conditioned analog signal 35).

In various implementations, the sigma-delta ADC feedback loop forces the output of the modulator to be a good representation of the input signal in the bandwidth of interest. The digital filter/decimator 70 can attenuate noise and/or slow a data rate (for example, to a Nyquist sampling rate) of the digital signal, providing the digital signal 45. The digital filter/decimator 70 can include a digital filter, a decimator, or both. The digital filter can attenuate the digital signal received from the sigma-delta modulator 60, and the decimator can reduce a sampling rate of the digital signal received from the sigma-delta modulator 60.

Figure 2:
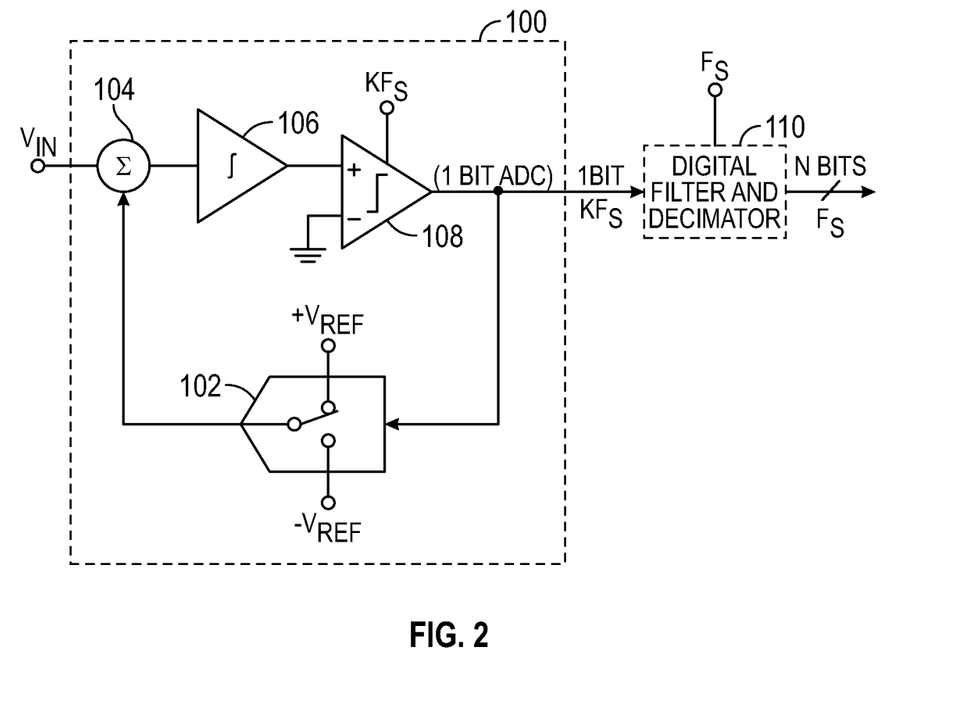
FIG. 2 is a block diagram of an example of a first-order single-bit sigma-delta ADC.

FIG. 2 is a block diagram of an example of a first-order single-bit sigma-delta ADC. The sigma-delta modulator 100 can be an example of the sigma-delta modulator 60 of FIG. 1. The sigma-delta modulator 100 can convert an input signal (Vin) into a continuous serial stream of ones and zeros at a rate determined by a sampling clock frequency $Kf_S$. A one-bit digital-to-analog converter (DAC) 102 can be driven by the serial output data stream to generate a feedback signal. The output of the digital-to-analog converter (DAC) 102 can be subtracted from the input signal using a summing element 104. The summing element 104 can be implemented as the summing node of an operational amplifier (op amp), such as the op amp of an integrator 106.

The integrator 106 can integrate the output of summing element 104, and the output of the integrator 106 can be applied to a clocked latched comparator 108. For an input signal of zero, the comparator output can include an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output can be applied to a digital filter and decimator 110 that averages every M cycles, where M is a positive integer greater than 1. The digital filter and decimator 110 can be an example of the digital filter/decimator 70 of FIG. 1. The decimator reduces the effective sampling rate at the output to fs.

Figure 3:
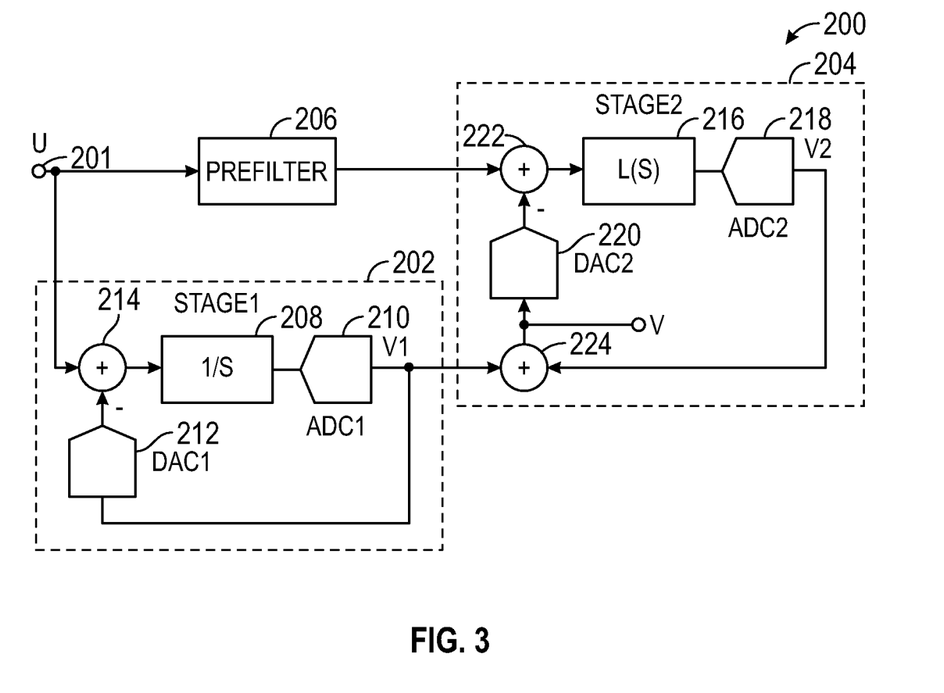
FIG. 3 is a block diagram of an example of a multi-stage sigma-delta ADC circuit that can implement various techniques of this disclosure.

FIG. 3 is a block diagram of an example of a multi-stage sigma-delta ADC circuit 200 that can implement various techniques of this disclosure. The multi-stage sigma-delta ADC circuit 200 can be an example of the sigma-delta modulator 60 of FIG. 1. The multi-stage sigma-delta ADC 200 can include a first stage ADC 202 and a second stage sigma-delta modulator 204.

The multi-stage sigma-delta ADC 200 can receive an analog input signal U at an input 201. The analog input signal U can be fed to an optional prefilter circuit 206 and to the first stage ADC 202. Similar to the sigma-delta modulator 100 in FIG. 2, the first stage ADC 202 can include an integrator 208, a first ADC circuit 210 (ADC1, a first quantizer), and a first DAC circuit 212 (DAC1).

The first stage ADC 202 can include an input summing node 214 configured to receive and combine the analog input signal U and an output of the first DAC circuit 212. The integrator 208 can integrate the output of input summing node 214, and the output of the integrator 208 can be applied to the first ADC circuit 210. The first stage ADC 202 can generate a digital output V1 that is a coarse approximation of the analog input signal U. The digital output V1 can be combined with the digital output V2 of the second stage through a summing node 224, converted back to the analog domain by DAC2, and subtracted from the prefiltered analog input signal U at the input summing node 222 of the second stage sigma-delta modulator 204.

In some examples, the multi-stage sigma-delta ADC 200 can include a prefilter circuit 206, such as an RC circuit, RLC circuit, or delay line. While the digital output V1 is being generated, the analog input signal U can change. The prefilter circuit 206 can optionally be included to better align in time/phase the analog input signal U and the coarse approximation digital output V1 and hence better cancel the analog input signal U. Because of this cancellation, the signal processed by second stage sigma-delta modulator 204 can be dominated by dither and quantization noise.

The second stage sigma-delta modulator 204 can include a loop filter 216, such as a first-order (or higher) integrator circuit, a second ADC circuit 218 (ADC2, a second quantizer), and a second DAC circuit 220 (DAC2). The second stage sigma-delta modulator 204 can receive the analog input signal U, or a filtered version of the analog input signal U by the prefilter circuit 206, at an input summing node 222. The input summing node 222 can be configured to receive and combine the analog input signal U (or a filtered version of the analog input signal U) and an output of the second DAC circuit 220. The loop filter 216 can integrate the output of the input summing node 222, and the output of the loop filter 216 can be applied to the second ADC circuit 218, which can generate a digital output V2. At a summing node 224 coupled to an input of the second DAC circuit 220, the digital output V2 can be combined with the digital output V1 from the first stage ADC 202. The digital output V of the multi-stage sigma-delta ADC 200 can be taken at the input of the second DAC circuit 220.

Figure 9:
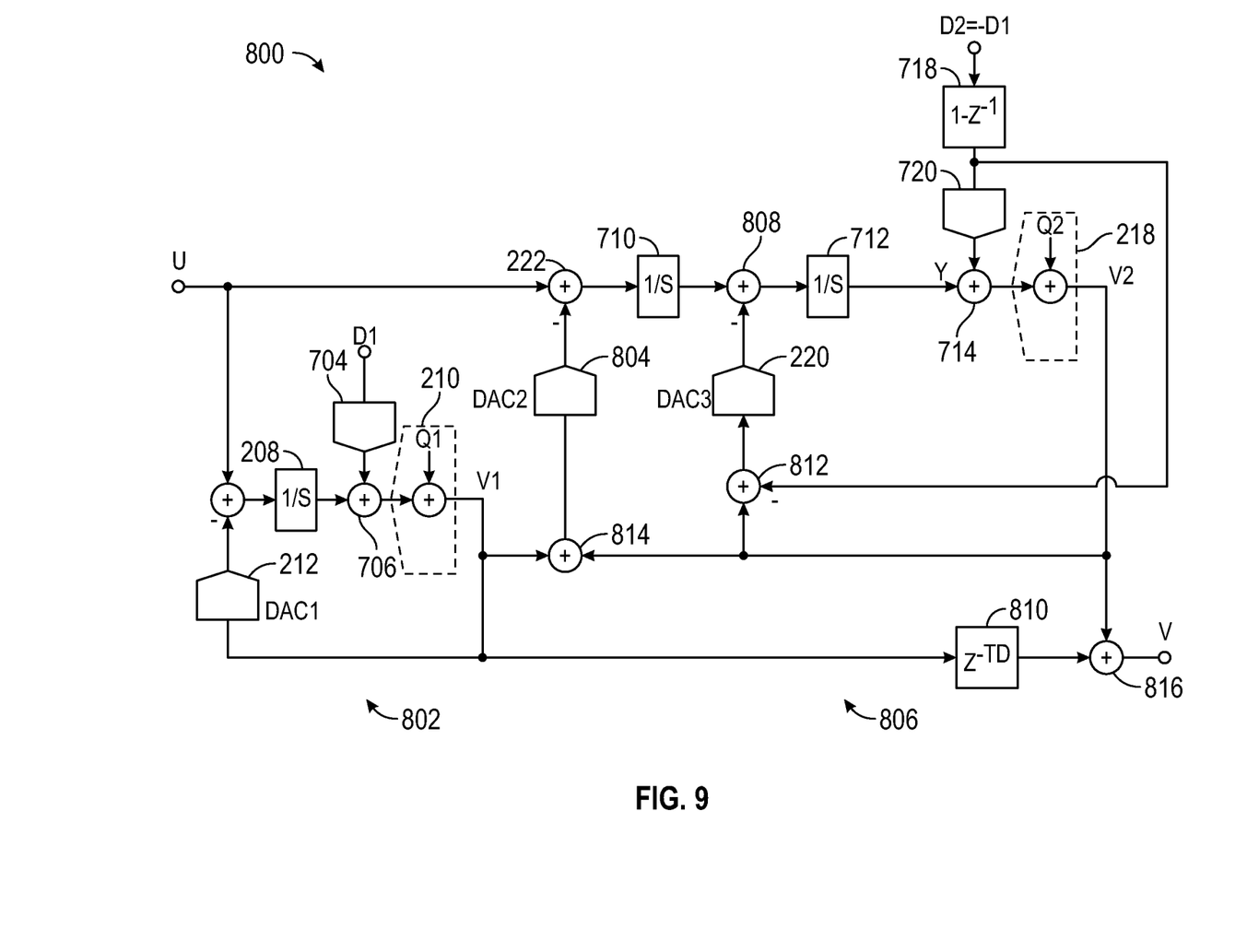
FIG. 9 is a block diagram of an example of a multi-stage sigma-delta ADC circuit in a feedback configuration that can implement various techniques of this disclosure.

In some implementations, a third DAC circuit can be included, such as shown in FIG. 9. For example, rather than applying the output V1 of the first stage ADC 202 to the summing node 224, a third DAC circuit can be coupled in parallel with the second DAC circuit 220 (DAC2) to receive and convert the output V1.

Figure 4:
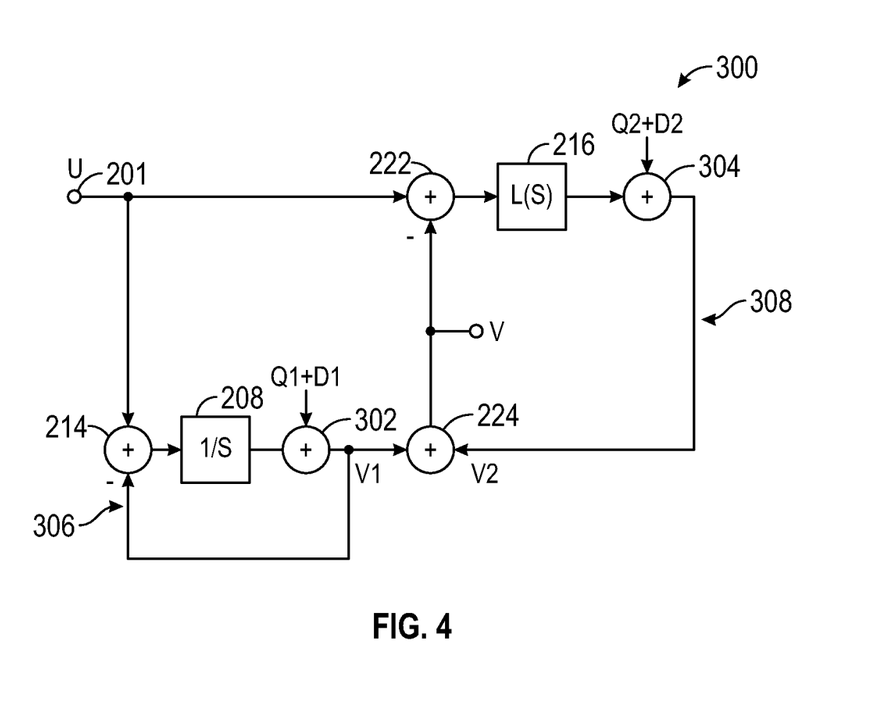
FIG. 4 is a simplified block diagram of an example of the multi-stage sigma-delta ADC circuit of FIG. 3, with dither added to both the first and second stages, in accordance with various techniques of this disclosure.

FIG. 4 is a simplified block diagram of an example of the multi-stage sigma-delta ADC circuit of FIG. 3, with dither added to both the first and second stages, in accordance with various techniques of this disclosure. The optional prefilter circuit 206, the first DAC circuit 212, and the second DAC circuit 220, all of FIG. 3, have been replaced by corresponding shorts, for simplicity. In addition, the quantizers of multi-stage sigma-delta ADC circuit 200 of FIG. 3, namely the first ADC circuit 210 (ADC1, a first quantizer) of the first stage, and the second ADC circuit 218 (ADC2, a second quantizer) of the second stage, have been modelled by summing nodes 302, 304, respectively, that add corresponding quantization noise and dither. In particular, a quantization noise Q1 and a dither signal D1 are added to the first stage ADC 306 by the summing node 302 and a quantization noise Q2 and a dither signal D2 are added to the second stage sigma-delta modulator 308 by the summing node 304. For example, the dither signal D1 can be added before the first ADC circuit 210 of FIG. 3, and the dither signal D2 can be added before the second ADC circuit 218 of FIG. 3.

In some examples, the first stage ADC 306 can be a flash ADC. In other examples, the first stage ADC 306 can be a sigma-delta ADC, such as a continuous-time sigma-delta ADC.

If the first stage ADC 306 is a first order continuous-time sigma-delta ADC, the digital output V1 of the first stage ADC is given by Equation 1, below:

$$V1 = STF1 * U + (1-z^{-1}) * (Q1+D1), \qquad \text{Equation 1}$$

where Q1 and D1 are the quantization noise and the dither signal of the first stage, respectively, STF1 is the signal transfer function (STF) of the first stage ADC 306, $(1-z^{-1})$ is a Z-domain transfer function, and the symbol * represents a multiplication operation.

Similarly, the digital output V2 of the main loop (the second stage sigma-delta modulator 308) is given by Equation 2, below:

$$V2 = STF2 * (U-V1) + NTF2 * (Q2+D2), \qquad \text{Equation 2}$$

where Q2 and D2 are the quantization noise and the dither signal of the second stage, respectively, and STF2 and NTF2 are the signal transfer function and noise transfer function (NTF) of the second stage, respectively.

The recombined digital output V is given by Equation 3, below:

$$V = V1+V2 = (STF2+STF1*(1-STF2))*U+(1-STF2)* \\ (1-z^{-1})*(Q1+D1)+NTF2*(Q2+D2) \qquad \text{Equation 3}$$

For in-band signals, STF2=1, and hence the recombined digital output V, in-band, can be written as Equation 4, below:

$$V = V1+V2 = U+NTF2*(Q2+D2) \qquad \text{Equation 4}$$

As seen in FIG. 3, the digital output V is also the input of the second DAC circuit 220 (DAC2) of the second stage sigma-delta modulator 204.

From Equation 3, it can be seen that the second DAC circuit 220 (DAC2) of FIG. 3 should be designed to have enough range to accommodate the signal U plus dither, e.g., shaped dither, and quantization noise from both stages. However, in accordance with various techniques of this disclosure, a second dither signal (D2) can be added to the second stage sigma-delta modulator 308 to offset a first dither signal (D1) of the first stage ADC 306 to substantially cancel the two dither signals. For example, the two added dither signals can combine and sum to approximately zero (referred to in this disclosure as subtractive dither) before the second DAC circuit 220 of the second stage sigma-delta modulator 204 of FIG. 3. The term offset does not mean a DC shift.

Figure 5:
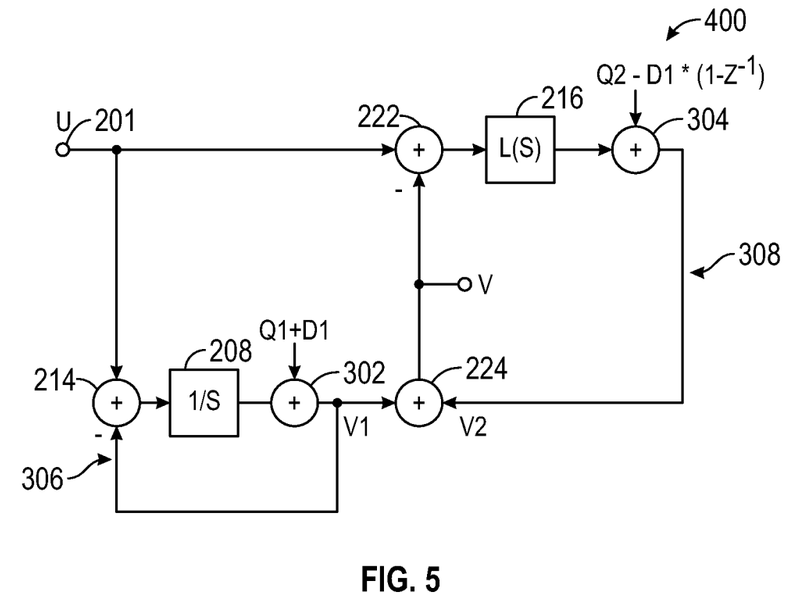
FIG. 5 is a simplified block diagram of an example of a multi-stage sigma-delta ADC circuit with shaped dither added to the second stage to substantially cancel a dither added to the first stage, in accordance with various techniques of this disclosure.

FIG. 5 is a simplified block diagram of an example of a multi-stage sigma-delta ADC circuit with shaped dither added to the second stage to substantially cancel a dither added to the first stage, in accordance with various techniques of this disclosure. The multi-stage sigma-delta ADC circuit 400 of FIG. 5 is similar to FIG. 4, with the shaped dither signal (D1*(1−$z^{-1}$)) replacing the dither signal D2 of FIG. 4 in stage 2. In some examples, the multi-stage sigma-delta ADC circuit 400 of FIG. 5 can be a continuous-time sigma-delta ADC circuit.

As seen in FIG. 5, a first dither signal D1 can be added to the first stage ADC 306, e.g., to a summing node coupled to an input of the first ADC circuit 210 of FIG. 3, and a second dither signal (−D1*(1−$z^{-1}$)) can be added to the second stage sigma-delta modulator 308, e.g., to a summing node coupled to an input of the second ADC circuit 218 of FIG. 3, where the first and second dither signal can combine and sum to approximately zero (referred to in this disclosure as subtractive dither) at a node coupled to an input of the second DAC circuit, such as the second DAC circuit 220 of the second stage sigma-delta modulator 204 of FIG. 3.

In FIG. 5, the second dither signal can be shaped by the NTF of the first stage in order for the first and second dither signals to substantially cancel at the summing node 224. For example, in FIG. 5, the second dither signal is shaped by a first-order NTF because the first stage is a first order ADC. If the first stage was a second-order ADC, then the second dither signal would be shaped by a second-order NTF, and so forth.

Figure 6:
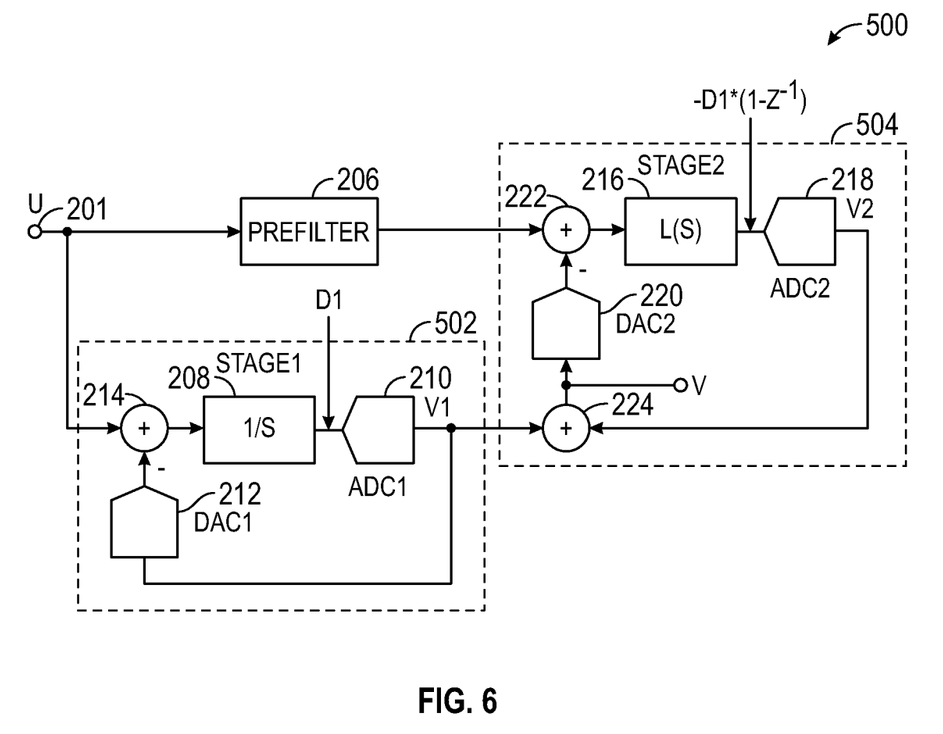
FIG. 6 is a block diagram of an example of a multi-stage sigma-delta ADC circuit that can implement various techniques of this disclosure.

By utilizing subtractive dither in a multi-stage ADC, the headroom requirements of the loop filter 216 in the main loop of the ADC 400, e.g., the second stage sigma-delta modulator 504 of FIG. 6, and the range requirements of a feedback DAC in the main loop, e.g., the second DAC circuit 220 of FIG. 6, can both be relaxed.

FIG. 6 is a block diagram of an example of a multi-stage sigma-delta ADC circuit 500 that can implement various techniques of this disclosure. The multi-stage sigma-delta ADC circuit 500 can be an example of the sigma-delta modulator 60 of FIG. 1.

The multi-stage sigma-delta ADC circuit 500 can include an input summing node 222 configured to receive and combine the analog input signal U and an output of one or more DAC circuits, such as the second DAC circuit 220 (DAC2). The multi-stage sigma-delta ADC circuit 500 can further include a first stage ADC 502 configured to receive the analog input signal U and a first dither signal D1 and to generate a first digital output V1 applied to an input of the second DAC circuit 220 (DAC2). In some examples, the first stage ADC 502 can include an integrator 208, a first ADC circuit 210 (ADC1, a first quantizer), and a first DAC circuit 212 (DAC1). Although shown in FIG. 6 as a first-order sigma-delta ADC, the first stage ADC 502 can be a higher order sigma-delta ADC or a Nyquist-rate ADC, such as a flash ADC or a successive approximation register (SAR) ADC. In this disclosure, a Nyquist-rate ADC includes any ADC used at the Nyquist rate (a non-oversampled converter).

The multi-stage sigma-delta ADC circuit 500 can further include a second stage sigma-delta modulator 504 configured to receive an output of the input summing node 222 and a second dither signal, such as a noise-shaped dither signal, e.g., dither signal (−D1*(1−$z^{1}$)), and to generate a second digital output V2 applied to an input of the second DAC circuit 220 (DAC2). The first dither signal D1 and the second dither signal (−D1*(1−$z^{1}$)) can offset one another at a summing node 224 coupled to an input of the second DAC circuit 220 (DAC2), where the first and second dither signal can combine and sum to approximately zero (referred to in this disclosure as subtractive dither) before the second DAC circuit 220 of the second stage sigma-delta modulator 504.

As shown in the example of FIG. 6, the first dither signal D1 can be added before the first ADC circuit 210 (ADC1), and the second dither signal, such as a noise-shaped dither signal, can be added before the second ADC circuit 218 (ADC2). For example, the first dither signal D1 can be a digital code applied to a first dither DAC coupled with a summing node at an input of the first ADC circuit 210 (ADC1), and the second dither signal can be a digital code applied to a second dither DAC coupled with a summing node at an input of the second ADC circuit 218 (ADC2).

In some examples, the multi-stage sigma-delta ADC circuit 500 can optionally include a prefilter circuit 206 coupled between an input 201 that is configured to receive the analog input signal U and the input summing node 222.

In some examples, the first stage ADC can include a flash ADC or a SAR ADC. In some examples, the first stage ADC can include a sigma-delta ADC. In some examples, the first stage ADC can include a first-order sigma-delta modulator, and the second stage sigma-delta modulator can include a second-order sigma-delta modulator. In other examples, the first stage ADC can include a second-order (or higher) sigma-delta modulator, and the second stage sigma-delta modulator includes a third-order (or higher) sigma-delta modulator.

Figure 7:
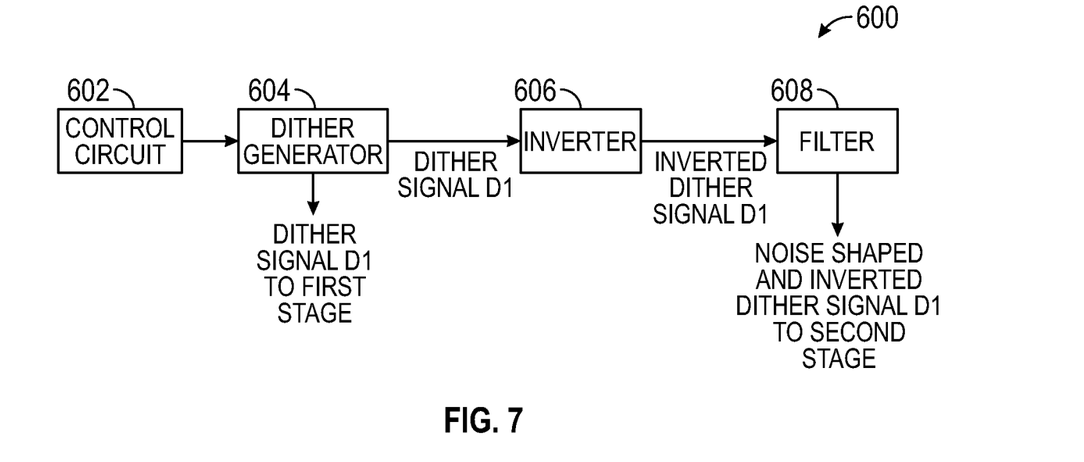
FIG. 7 is a block diagram depicting an example of a dither signal generation circuit.

FIG. 7 is a block diagram depicting an example of a dither signal generation circuit. The dither signal generation circuit 600 of FIG. 7 can include a control circuit 602 configured to control a dither generator 604, e.g., such as including a pseudo-random number generator, to generate a dither signal. The dither generator 604 can generate a first dither signal, such as the first dither signal D1.

The first dither signal D1 can be a digital code that can be applied to a dither DAC coupled with the first stage ADC 502 of FIG. 6, for example. In addition, the first dither signal D1 (a code) can be applied to a digital inverter 606, which changes the sign of the dither signal D1. The inverted first dither signal D1 can be applied to a digital filter 608, e.g., a FIR filter, that can perform noise shaping on the inverted first dither signal D1. The digital filter 608 can shape the inverted first dither signal D1 by the NTF of the first stage, and apply the noise shaped, inverted first dither signal D1 (the second dither signal) to the second stage.

The subtractive dither techniques described above are applicable to both feed-forward and feedback configurations. An example of a feed-forward configuration using subtractive dither is shown in FIG. 8 and an example of a feedback configuration using subtractive dither is shown in FIG. 9.

Figure 8:
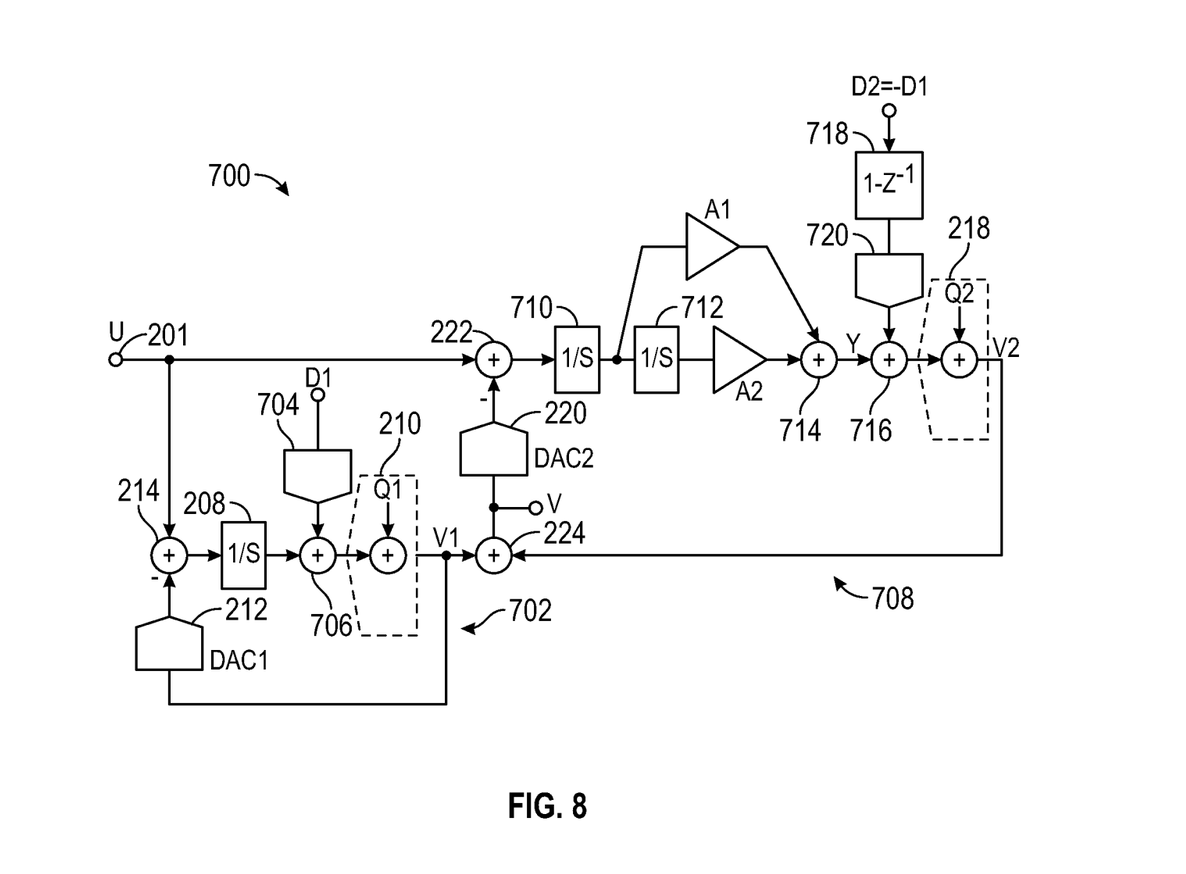
FIG. 8 is a block diagram of an example of a multi-stage sigma-delta ADC circuit in a feed-forward configuration that can implement various techniques of this disclosure.

FIG. 8 is a block diagram of an example of a multi-stage sigma-delta ADC circuit 700 in a feed-forward configuration that can implement various techniques of this disclosure. The multi-stage sigma-delta ADC circuit 700 can be an example of the sigma-delta modulator 60 of FIG. 1.

The multi-stage sigma-delta ADC circuit 700 can include an input summing node 222 configured to receive and combine the analog input signal U and an output of one or more DAC circuits, such as the second DAC circuit 220 (DAC2). The multi-stage sigma-delta ADC circuit 700 can include a first stage ADC 702 configured to receive the analog input signal U and a first dither signal D1 and to generate a first digital output V1 applied to an input of the second DAC circuit 220 (DAC2).

The first stage ADC 702 of FIG. 8 is similar to the first stage ADC 502 of FIG. 6, but with a first dither DAC 704, as described above with respect to FIG. 7, explicitly shown. The first dither signal D1 can be a digital code generated by a dither generator, such as the dither generator 604 of FIG. 7, and applied to the first dither DAC 704.

Similar to the sigma-delta modulator 100 in FIG. 2, the first stage ADC 702 can include an integrator 208, a first ADC circuit 210 (ADC1, a first quantizer), and a first DAC circuit 212 (DAC1). The first dither DAC 704 can be coupled with an input of the first ADC circuit 210 (ADC1) by a summing node 706. Although shown in FIG. 8 as a first-order sigma-delta ADC, the first stage ADC 702 can be a higher order sigma-delta ADC or a flash ADC.

The multi-stage sigma-delta ADC circuit 700 can further include a second stage sigma-delta modulator 708 configured to receive an output of the input summing node 222 and a second dither signal. The second stage sigma-delta modulator 708 can include a first integrator 710, a second integrator 712, a second ADC circuit 218 (ADC2, a second quantizer), and a second DAC circuit 220 (DAC2).

In the feed-forward configuration shown, the output of the first integrator 710 of the second stage sigma-delta modulator 708 is fed forward to a summing node 714 using a first feed-forward coefficient a1, and the output of the second integrator 712 of the second stage sigma-delta modulator 708 is fed forward to the summing node 714 using a second feed-forward coefficient a2. The output y of the summing node 714 is fed to the summing node 716.

As described above with respect to FIG. 7, a dither code D2=−D1 can be applied to a filter 718, such as a FIR filter, and then applied to a second dither DAC 720. The filter 718 can shape the dither signal according to the NTF of the first stage ADC 702, such as $(1-z^{-1})$ in the first order example shown.

The second dither DAC 720 can be coupled with an input of the second ADC circuit 218 (ADC2) by the summing node 716, combined with the output y from the summing node 714, and the second ADC circuit 218 (ADC2) can generate a second digital output V2 applied to an input of the second DAC circuit 220 (DAC2). The first dither signal and the second dither signal can offset one another at a summing node 224 coupled to an input of the second DAC circuit 220 (DAC2), where the first and second dither signal can combine and sum to approximately zero (referred to in this disclosure as subtractive dither) before the second DAC circuit 220 of the second stage sigma-delta modulator 708. Although shown in FIG. 8 as a second-order sigma-delta modulator, the second stage can be a first order or a third or higher order sigma-delta modulator.

FIG. 9 is a block diagram of an example of a multi-stage sigma-delta ADC circuit 800 in a feedback configuration that can implement various techniques of this disclosure. The multi-stage sigma-delta ADC circuit 800 can be an example of the sigma-delta modulator 60 of FIG. 1.

The multi-stage sigma-delta ADC circuit 800 can include an input summing node 222 configured to receive and combine the analog input signal U and an output of one or more DAC circuits, such as a DAC circuit 220 (DAC2). The multi-stage sigma-delta ADC circuit 800 can include a first stage ADC 802 configured to receive the analog input signal U and a first dither signal D1 and to generate a first digital output V1 applied to an input of a DAC circuit 804 (DAC2).

The first stage ADC 802 of FIG. 9 is similar to the first stage ADC 702 of FIG. 8. The first dither signal D1 can be a digital code generated by a dither generator, such as the dither generator 604 of FIG. 7, and applied to the first dither DAC 704.

Similar to the sigma-delta modulator 100 in FIG. 2, the first stage ADC 802 can include an integrator 208, a first ADC circuit 210 (a first quantizer), and a first DAC circuit 212 (DAC1). The first dither DAC 704 can be coupled with an input of the first ADC circuit 210 by a summing node 706. Although shown in FIG. 9 as a first-order sigma-delta ADC, the first stage ADC 802 can be a higher order sigma-delta ADC or a flash ADC.

The multi-stage sigma-delta ADC circuit 800 can further include a second stage sigma-delta modulator 806 configured to receive an output of the input summing node 222 and a second dither signal. The second stage sigma-delta modulator 806 can include a first integrator 710, a second integrator 712, a second ADC circuit 218 (a second quantizer), and a third DAC circuit 220 (DAC3).

In the feedback configuration shown, the output of the first integrator 710 of the second stage sigma-delta modulator 708 is fed forward to a summing node 808 and combined with the output of the third DAC circuit 220 (DAC3). The output of the summing node 808 is fed to the second integrator 712. The output y of the second integrator 712 of the second stage sigma-delta modulator 708 is fed to the summing node 714.

As described above with respect to FIG. 7, a dither code D2=−D1 can be applied to a filter 718, such as a FIR filter, and then applied to a second dither DAC 720. The filter 718 can shape the dither signal according to the NTF of the first stage ADC 802, such as $(1-z^{-1})$ in the first order example shown.

The second dither DAC 720 can be coupled with an input of the second ADC circuit 218 by the summing node 714, combined with the output y from the second integrator 712, and the second ADC circuit 218 can generate a second digital output V2.

The second dither signal from the filter 718 is combined with the second digital output V2 at a summing node 812 coupled with an input of the third DAC circuit 220 (DAC3). The third DAC circuit 220 (DAC3) converts the combined signal, which is then fed to the summing node 808 at the input of the second integrator 712.

The second digital output V2 contains the second dither signal D2. By adding dither, additional DAC levels may be necessary, which can increase the complexity of the DAC. Here, however, the second dither signal D2 is subtracted from the second digital output V2 at summing node 812, which is coupled with the input of the third DAC circuit 220 (DAC3). In this manner, the third DAC circuit 220 (DAC3) can be driven with a dither free signal, and no additional DAC levels are needed in the third DAC circuit 220 (DAC3).

The first digital output V1 is combined with the second digital output V2 at a summing node 814 coupled with an input of the second DAC circuit 804 (DAC2). At the summing node 814, the first dither signal and the second dither signal can offset one another, where the first and second dither signal can combine and sum to approximately zero (referred to in this disclosure as subtractive dither). The second DAC circuit 804 (DAC2) converts the combined signal, which is then fed to the summing node 222 at the input of the first integrator 710.

Finally, the first digital output V1 is delayed by a delay element 810 and then combined with the second digital output V2 at a summing node 816 to generate the recombined digital output V.

Although shown in FIG. 9 as a second-order sigma-delta modulator, the second stage can be a first order or a third or higher order sigma-delta modulator. In addition, in some implementations, the feedback configuration shown in FIG. 9 can include direct feedback—sometimes called excess loop delay compensation—that includes an excess loop delay DAC (ELD DAC).

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A multi-stage sigma-delta analog-to-digital converter (ADC) configured to receive an analog input signal at an input and generate a digital output signal, the multi-stage sigma-delta ADC comprising:
    an input summing node configured to receive and combine the analog input signal and an output of a digital-to-analog converter (DAC) circuit;
    a first stage ADC configured to receive the analog input signal and a first dither signal and to generate a first output to the digital-to-analog converter (DAC) circuit; and
    a second stage sigma-delta modulator configured to receive an output of the input summing node and a second dither signal and to generate a second output to the digital-to-analog converter (DAC) circuit,
    wherein the first dither signal and the second dither signal offset one another at a node coupled to an input of the DAC circuit.

2. The multi-stage sigma-delta ADC of claim 1, wherein the second dither signal is a noise shaped dither signal.

3. The multi-stage sigma-delta ADC of claim 1, wherein the second dither signal is a noise shaped dither signal that is shaped by a noise transfer function of the first stage ADC.

4. The multi-stage sigma-delta ADC of claim 1, comprising:
    a prefilter circuit coupled between the input and the input summing node.

5. The multi-stage sigma-delta ADC of claim 1, wherein the second stage sigma-delta modulator is configured in a feed-forward configuration.

6. The multi-stage sigma-delta ADC of claim 1, wherein the second stage sigma-delta modulator is configured in a feedback configuration.

7. The multi-stage sigma-delta ADC of claim 1, wherein the first stage ADC includes a first-order sigma-delta modulator, and wherein the second stage sigma-delta modulator includes a second-order sigma-delta modulator.

8. The multi-stage sigma-delta ADC of claim 1, wherein the first stage sigma-delta modulator includes a first ADC, wherein the second stage sigma-delta modulator includes a second ADC, wherein the first dither signal is applied to a summing node coupled to an input of the first ADC, and wherein the second dither signal is applied to a summing node coupled to an input of the second ADC.

9. The multi-stage sigma-delta ADC of claim 1, wherein the first dither signal and the second dither signal cancel one another at a node coupled to an input of the DAC circuit.

10. The multi-stage sigma-delta ADC of claim 1, wherein the sigma-delta ADC is a continuous-time ADC.

11. The multi-stage sigma-delta ADC of claim 1, wherein the first stage ADC includes a Nyquist-rate ADC.

12. The multi-stage sigma-delta ADC of claim 1, wherein the first stage ADC includes a sigma-delta ADC.

13. A method of using a multi-stage sigma-delta analog-to-digital converter (ADC) configured to receive an analog input signal at an input and generate a digital output signal, the method comprising:
  receiving and combining the analog input signal and an output of a digital-to-analog converter (DAC) circuit at an input summing node;
  receiving, by a first stage ADC, the analog input signal and a first dither signal and generating a first output to the digital-to-analog converter (DAC) circuit; and
  receiving, by a second stage sigma-delta modulator, an output of the input summing node and a second dither signal and generating a second output to the digital-to-analog converter (DAC) circuit,
  wherein the first dither signal and the second dither signal offset one another at a node coupled to an input of the DAC circuit.

14. The method of claim 13, comprising:
  noise shaping the second dither signal by a noise transfer function of the first stage ADC.

15. The method of claim 13, comprising:
  prefiltering the analog input signal between the input and the input summing node.

16. The method of claim 13, comprising:
  in the second stage sigma-delta modulator, applying feed-forward coefficients in a feed-forward configuration.

17. The method of claim 13, comprising:
  in the second stage sigma-delta modulator, applying feedback coefficients in a feedback configuration.

18. The method of claim 13, wherein the first stage ADC includes a first-order sigma-delta modulator, and wherein the second stage sigma-delta modulator includes a second-order sigma-delta modulator.

19. A multi-stage sigma-delta analog-to-digital converter (ADC) configured to receive an analog input signal at an input and generate a digital output signal, the multi-stage sigma-delta ADC comprising:
  means for receiving and combining the analog input signal and an output of a digital-to-analog converter (DAC) circuit;
  means for receiving, by a first stage ADC, the analog input signal and a first dither signal and generating a first output to the digital-to-analog converter (DAC) circuit; and
  means for receiving, by a second stage sigma-delta modulator, an output of an input summing node and a second dither signal and generating a second output to the digital-to-analog converter (DAC) circuit,
  wherein the first dither signal and the second dither signal offset one another at a node coupled to an input of the DAC circuit.

20. The multi-stage sigma-delta ADC of claim 19, the multi-stage sigma-delta ADC comprising:
  means for noise shaping the second dither signal by a noise transfer function of the first stage ADC.

* * * * *